US011585874B2

(12) United States Patent
Swerts et al.

(10) Patent No.: US 11,585,874 B2
(45) Date of Patent: Feb. 21, 2023

(54) MAGNETIC TUNNEL JUNCTION DEVICE

(71) Applicant: IMEC vzw, Leuven (BE)

(72) Inventors: Johan Swerts, Leuven (BE); Kevin Garello, Leuven (BE)

(73) Assignee: IMEC vzw, Leuven (BE)

(*) Notice: Subject to any disclaimer, the term of this patent is extended or adjusted under 35 U.S.C. 154(b) by 39 days.

(21) Appl. No.: 16/855,403

(22) Filed: Apr. 22, 2020

(65) Prior Publication Data
US 2020/0341079 A1   Oct. 29, 2020

(30) Foreign Application Priority Data

Apr. 23, 2019  (EP) .................................... 19170492

(51) Int. Cl.
G01R 33/09 (2006.01)
G11C 11/16 (2006.01)
(Continued)

(52) U.S. Cl.
CPC .......... *G01R 33/098* (2013.01); *G11C 11/161* (2013.01); *H01L 27/222* (2013.01);
(Continued)

(58) Field of Classification Search
CPC ... G01R 33/098; G11C 11/161; H01L 27/222; H01L 43/02; H01L 43/08; H01L 43/10
See application file for complete search history.

(56) References Cited

U.S. PATENT DOCUMENTS

2007/0063237 A1  3/2007  Huai et al.
2016/0042778 A1* 2/2016  Manipatruni ....... G11C 11/1655
                                                    365/66
(Continued)

FOREIGN PATENT DOCUMENTS

EP      3 442 042 A1    2/2019
WO  WO 2012/170689 A1  12/2012
(Continued)

OTHER PUBLICATIONS

Timothy H. Boyer, The force on a magnetic dipole, Am. J. Phys. 56 (8), Aug. 1988, pp. 688-692 (Year: 1988).*
(Continued)

*Primary Examiner* — Shih Tsun A Chou
(74) *Attorney, Agent, or Firm* — Knobbe, Martens, Olson & Bear, LLP

(57) ABSTRACT

The disclosed technology relates generally to semiconductor devices and more particularly to magnetic tunnel junction devices. According to an aspect, an MTJ device comprises a spin-orbit-torque (SOT)-layer. The MTJ device additionally comprises a first free layer, a second free layer, a reference layer and a tunnel barrier layer arranged between the second free layer and the reference layer. The MTJ device further comprises a spacer layer arranged as an interfacial layer between the first free layer and the second free layer. The SOT-layer is adapted to switch a magnetization direction of the first free layer through SOT. The first free layer is adapted to generate a magnetic stray field acting on the second free layer such that a magnetization direction of the second free layer is responsive to a magnetization direction of the first free layer. According to another aspect, a circuit comprises the MTJ device.

18 Claims, 5 Drawing Sheets

(51) Int. Cl.
- *H01L 27/22* (2006.01)
- *H01L 43/02* (2006.01)
- *H01L 43/08* (2006.01)
- *H01L 43/10* (2006.01)

(52) U.S. Cl.
  CPC .............. *H01L 43/02* (2013.01); *H01L 43/08* (2013.01); *H01L 43/10* (2013.01)

(56) References Cited

U.S. PATENT DOCUMENTS

| | | | |
|---|---|---|---|
| 2016/0300999 A1 | 10/2016 | Yi et al. | |
| 2018/0159026 A1 | 6/2018 | Shiokawa et al. | |
| 2018/0190419 A1 | 7/2018 | Swerts et al. | |
| 2018/0366172 A1 | 12/2018 | Wang et al. | |
| 2019/0295617 A1* | 9/2019 | Wang | G11C 11/1675 |
| 2020/0278403 A1* | 9/2020 | Shiokawa | H01L 43/04 |

FOREIGN PATENT DOCUMENTS

| | | |
|---|---|---|
| WO | WO 2016/048378 A1 | 3/2016 |
| WO | WO 2018/182645 A1 | 10/2018 |
| WO | WO 2018/182651 A1 | 10/2018 |

OTHER PUBLICATIONS

Ling et al., University Physics vol. 2, Rice University, 2018, pp. 560-566 (Year: 2018).*

Couet et al., "Impact of Ta and W-based spacers in double MgO STT-MRAM free layers on perpendicular anisotropy and damping", Applied Physics Letters, vol. 111, 152406-1-152406-4 (2017).

Hui-Qiang et al., "Low frequency noise in asymmetric double barrier magnetic tunnel junctions with a top thin MgO layer", Chin. Phys. B, vol. 24, No. 7 (2015) 078504-1-078504-4.

Hung et al., "Wide operation margin of toggle mode switching for magnetic random access memory with preceding negative pulse writing scheme", Applied Physics Letters, vol. 88, pp. 112501-1-112501-3, 2006.

Liu et al., "Top-Pinned STT-MRAM Devices With High Thermal Stability Hybrid Free Layers for High-Density Memory Applications", IEEE Transactions on Magnetics, vol. 54 (11) (2018).

Sousa, R., "Spintronics memory function : materials and device concepts", Mesoscopic Systems and Quantum Hall Effect [cond-mat.mes-hall]. Universite Grenoble Alpes, 2017. <tel-01673315>.

Yoshida et al., "Demonstration of zero-offset-field operation for top-pinned MTJ with synthetic antiferromagnetic free layer," 2013 IEEE International Electron Devices Meeting, Washington, DC (2013).

Yuan et al., "Lowfrequencynoiseinmagnetictunnelingjunctions with $Co_{40}Fe_{40}B_{20}/Co_{70.5}Fe_{4.5}Si_{15}B_{10}$ compositefreelayer", Journal of Magnetism and Magnetic Materials, vol. 398, pp. 215-219, 2016.

Zhang et al., "Spin-orbit torque in a completely compensated synthetic antiferromagnet", Physical Review B, vol. 97, 214403-1-214403-7, 2018.

Zhu et al., "Magnetic tunnel junctions", materialstoday, vol. 9, No. 11, pp. 36-45, Nov. 2006.

Extended European Search Report dated Nov. 6, 2019 in counterpart Application No. 19170492.3.

* cited by examiner

MAGNETIC TUNNEL JUNCTION DEVICE

CROSS-REFERENCE TO RELATED APPLICATIONS

This application claims foreign priority to European Application No. EP 19170492.3, filed Apr. 23, 2019, the content of which is incorporated by reference herein in its entirety.

BACKGROUND

Field

The disclosed technology relates generally to semiconductor devices and more particularly to magnetic tunnel junction devices.

Description of the Related Technology

As the demand for faster, smaller, and more power-efficient devices is increasing, conventional memories such as static random access memory (SRAM) and dynamic random access memory (DRAM) are reaching their scaling limits. New emerging memories are being developed and magnetic random access memory (MRAM) is considered as one of the most promising replacements. MRAM has the potential of becoming the next generation large-scale application of spintronics. Spintronics is a rapidly growing field of solid-state electronics that aims to take advantage of the spin of electrons, in addition to their electric charge, as a way of implementing new electronic functions.

One promising candidate advantageously utilizes an effect referred to as spin-orbit-torque (SOT) induced switching, where the magnetization dynamics occur via a current induced spin-orbit coupling. FIG. 1 schematically shows an MTJ configured for SOT-induced free layer switching. The MTJ comprises a free layer 12, a tunnel barrier layer 14, a reference layer 16 and a pinning layer 18 fixing the magnetization of the reference layer 14. The free layer 12 is formed on an SOT-layer. The SOT-layer can be a non-magnetic metal layer comprising, for instance, Ta, W, or Pt, or topological insulators such as such as $Bi_2Se_3$. By passing an in-plane current Ism through the SOT-layer 10, a perpendicular spin current may be generated and transferred to the magnetization of the free layer 12, thereby creating a spin torque in the free layer 12 and inducing magnetization reversal. The origin of the spin current may be described by the Spin hall-effect (in the bulk of the SOT-layer 10) and from Rashba interaction (at the interface between the SOT-layer 10 and the free layer 12).

SUMMARY OF CERTAIN INVENTIVE ASPECTS

As realized by the inventors, an issue in current spin-orbit-torque (SOT)-based technology is the compromise that needs to be made between: the SOT-generating efficiency of the SOT-layer, the spin-polarizing efficiency of the free layer which contributes to the TMR of the tunnel junction, and the free layer retention performance.

Therefore, it is an object of the present inventive concept to address this issue. Another object is to enable an improved flexibility in the design of an MTJ for SOT-induced switching. Further and alternative objectives may be understood from the following.

According to a first aspect of the present inventive concept there is provided an MTJ device comprising a layer stack comprising:
a SOT-layer and a first free layer,
a second free layer, a reference layer and a tunnel barrier layer arranged between the second free layer and the reference layer, and
a spacer layer arranged as an interfacial layer between the first free layer and the second free layer,
wherein the SOT-layer is adapted to switch a magnetization direction of the first free layer through SOT, and
wherein the first free layer is adapted to generate a magnetic stray field acting on the second free layer such that a magnetization direction of the second free layer is responsive to a magnetization direction of the first free layer.

According to a second aspect of the present inventive concept there is provided a memory device comprising at least one memory cell, each memory cell comprising a magnetic tunnel junction device according to the first aspect.

According to a typical conventional design of an SOT-based MTJ device, a same free layer is used both for SOT-switching, that is storage function, and sensing. In contrast, the inventive aspect provides a layer stack comprising a first and a second free layer separated by a spacer, which enables switching of the first free layer via SOT and sensing of a magnetization direction of the first free layer via the second free layer. Hence, the first free layer may be configured as a "storage layer" and the second free layer may be configured as a "sense layer". Accordingly, the SOT-layer and the first free layer may form part of a "storage sub-stack", and the second free layer, the tunnel barrier layer and the reference layer may form part of a "MTJ sensing sub-stack" (or for brevity "sensing sub-stack"), wherein the storage sub-stack and the sensing sub-stack are separated by the spacer layer.

The separation between the storage sub-stack and the sensing sub-stack provided by the spacer allows the respective sub-stacks to be tailored individually (e.g. with respect to materials and layer compositions), with an aim of improving their respective functions in the stack. This may enable performance gains in terms of SOT switching efficiency, TMR and retention. A further advantage is enabling of an improved thermal robustness and compatibility with back-end-of-line (BEOL) processing.

By the dual free layer design a larger off-set field of the second free layer can be tolerated compared to a conventional single-free layer SOT design. Since the second free layer is used as a sensing layer and not as writing or storage layer a second free layer offset does not lead to writing asymmetry or retention loss, respectively. This also confers flexibility of the pinning layer design, for instance enabling use of a non-compensated synthetic antiferromagnetic (SAF) pinning layer or a non-SAF pinning layer such as synthetic ferromagnetic (SFM) pinning layer.

According to the inventive aspect, the coupling between the free layers relies on (magnetostatic) stray field interaction. That is, the magnetic stray field generated by the first free layer acts to orient the magnetization direction of the second free layer to align with the direction of the stray field extending through the second free layer. The direction of the magnetic stray field is determined by the magnetization direction of the first free layer.

Thus, the SOT-layer may, in response to a switching current, through SOT induce a reversal of a magnetization vector of the first free layer, wherein the reversal of the magnetization vector of the first free layer induces a reversal of a magnetization vector of the second free layer, through magnetic stray field coupling.

The strength of the stray field tends to increase with reduced layer critical dimensions (CD). This is in fact favorable due to the general trend in circuit design and device development trend towards ever smaller CDs.

The stray field interaction further provides a considerable freedom in the design of the spacer layer as the coupling between the magnetizations of the first and second free layers do not rely on magnetic exchange coupling, also known as interlayer exchange coupling (IEC) and Ruderman-Kittel-Kasuya-Yosida (RKKY) exchange coupling.

For instance, it is possible to form the spacer layer as a non-magnetic layer, such as a non-magnetic metal layer. Moreover, the spacer may be adapted to provide both a texture breaking function between the two free layers as well as acting as an interfacial layer between the two free layers, with the respective interfaces being adapted to promote the properties of the first free layer and the second free layer with respect to their intended purpose.

As used herein, a magnetization of a layer refers to the net magnetization of said layer, i.e. equivalent to the sum of the elementary magnetic moments of the layer, unless explicitly stated otherwise.

Meanwhile, a magnetization vector of a layer refers to the vector of the (net) magnetization of the layer. A direction or an orientation of a magnetization of a layer refers to the direction or orientation of the magnetization vector of the layer. Moreover, a given magnetization state (e.g. a P- or AP-state) of a layer refers to a given orientation of the magnetization of the layer.

As used herein, a free layer refers to a layer having a magnetization which may be varied. That is, the direction of the magnetization vector of the free layer may be varied.

The magnetization direction of the first free layer may be switchable between a first direction wherein the magnetization direction of the first free layer is aligned with the magnetization direction of the reference layer, and a second direction wherein the magnetization direction of the first free layer is oriented against the magnetization direction of the reference layer. The first and second directions may be opposite directions. The first direction may be parallel to the magnetization direction of the reference layer and the second direction may be anti-parallel to the magnetization direction of the reference layer. The first free layer may accordingly be switched between a parallel state (P state), wherein the magnetization direction of the free layer is parallel to the magnetization direction of the reference layer, and an anti-parallel state (AP state) wherein the magnetization direction of the free layer is anti-parallel to the magnetization direction of the reference layer. The magnetization vector of the second free layer may in turn (through the stray field coupling) be oriented along or against the magnetization direction of the reference layer. Preferably, the second free layer may be switched to a P state (with respect to the reference layer) in response to the first free layer being switched to the P state, and to an AP state (with respect to the reference layer) in response to the second free layer being switching to the AP state.

A tunnel barrier layer is a layer arranged between the reference layer and the free layer of the MTJ. The tunnel barrier layer may be adapted to allow a tunneling current across the tunnel barrier layer. The tunnel barrier layer may be a non-magnetic and electrically insulating layer, typically an oxide layer. The tunnel barrier layer may be adapted to allow electrons to tunnel between the reference layer and the second free layer.

A reference layer is a layer having a magnetization which is fixed or pinned. That is, the direction of the magnetization vector of the reference layer is fixed or pinned. The reference layer may also be referred to as the fixed layer or the pinned layer. The magnetization of the reference layer may be oriented in-plane (in-plane magnetic anisotropy) or out of plane (PMA).

A pinning layer is a layer which pins the magnetization of the reference layer. A pinning layer may be a hard magnetic layer having a high (magnetic) coercivity. The pinning layer enables the magnetization direction of one or more associated reference layers to be pinned. By the pinning effect exerted on the reference layer, the reversal field of the reference layer may be increased compared to the free layer(s).

An SOT-generating layer ("SOT-layer") is a layer configured to, in response to conducting an SOT-switching current, inject a spin current into a free layer (e.g. the first free layer) inducing magnetization reversal in the free layer through SOT. An SOT-layer may be arranged in contact with the associated free layer. An SOT-layer may be configured to conduct a current within the plane of extension of the SOT-layer, and consequently along or parallel to the associated free layer.

Both single- and composite-layered spacer layer designs are possible. In other words, the spacer layer may comprise at least a first spacer sublayer.

The first spacer sublayer may be an SOT-generating layer arranged in contact with a surface of the first free layer, wherein a sign of an SOT-coefficient of the first spacer sublayer may be opposite to a sign of an SOT-coefficient of the SOT layer. The first spacer sublayer and the SOT-layer may thus both contribute positively to the switching, hence resulting in an effectively minimized switching current density for the first free layer.

The SOT-layer and the first spacer sublayer may be formed of different materials presenting SOT-coefficients with opposite signs.

The SOT-generating layer may comprise a topological insulator (TI). Topological insulators enable forming of layers with a strong spin-orbit coupling. However, the first spacer sublayer/SOT-generating layer may alternatively comprise an SOT-generating metal, such as a heavy metal.

The spacer layer may comprise a second spacer sublayer arranged in contact with the first sublayer. The first sublayer may accordingly be selected considering compatibility with respect to the first free layer while the second sublayer may be selected considering compatibility with respect to the second free layer.

For example, in case the first sublayer comprises a topological insulator the second sublayer (and optional further sublayers) may be selected to provide a texture enhancing a magnetic anisotropy of the second free layer. For instance, it may be challenging to form a second free layer with a perpendicular magnetic anisotropy (PMA) adjacent to a topological insulator layer. This challenge may however be mitigated by forming the second spacer sublayer as a PMA-promoting layer. An advantageous structure of a spacer layer formed of a first and a second spacer sublayer comprises a first spacer sublayer formed by a SOT-generating layer and a second spacer sublayer of W, Ti, Pd, Pt, Ta, Ru, Mo or Ti or a bi-layer of Ru/Mo.

The second spacer sublayer may comprise at least one metal layer. The second spacer sublayer may for instance be a single metal layer or a metal bi-layer. The second spacer sublayer may form a non-magnetic metal layer.

The spacer layer may comprise a third spacer sublayer arranged in contact with the second sublayer and comprising an oxide layer having a (001) crystal structure orientation. In the following, a crystal structure with indices ijk may hereinafter be denoted in the format (ijk), or may equivalently be denoted ijk to avoid confusion with reference signs in the claims. The spacer layer may hence be suitable for use in combination with a Fe- or Co-based second free layer, such as a second free layer comprising a Fe-, Co-, FeB-, CoB-, CoFe- or CoFeB-layer, wherein the (001) crystal texture of the oxide layer may promote PMA of the second free layer. A Fe- and/or Co-based MTJ enables a high TMR.

The oxide layer may preferably be a Mg-comprising oxide layer. A Mg-comprising oxide layer may efficiently promote PMA in the second free layer. A further advantage of including an oxide layer in the spacer layer is that the resistance of the spacer layer may be increased, hence more efficiently oppose the SOT-current from flowing into the second free layer.

The third spacer sublayer may comprise a B-comprising layer, wherein the B-comprising layer is arranged in contact with the second sub-layer and the oxide layer is arranged in contact with the second free layer. The B-comprising layer may promote a (001) crystal structure orientation of the oxide layer. The B-comprising layer may be a CoFeB-layer, a CoB-layer or a FeB-layer.

A thickness of the spacer layer may be 5 nm or less. If the spacer layer comprises a CoFeB-layer, a thickness of the CoFeB-layer is preferably 1 nm or less, more preferably 0.4-0.5 nm. Such a thickness allows the CoFeB-layer to provide a texture promoting function with respect to the oxide-layer and to be formed as a (at least substantially) non-magnetic layer.

An advantageous structure of a spacer layer formed of a first, second and third spacer sublayer comprises a first spacer sublayer formed by a SOT-generating layer, a second spacer sublayer of W, Ti, Pd, Pt, Ta, Ru, Mo or Ti or a bi-layer of Ru/Mo, and a third spacer sublayer formed of an Mg-comprising oxide layer or of a CoFeB-layer and a Mg-comprising oxide layer.

The second free layer may have a coercivity which is less than a strength of the magnetic stray field acting on the second free layer. This enables the magnetization switching of the second free layer to be controlled by only the stray field generated by the first free layer, without requiring any further fields or currents to facilitate the switching.

A strength of the magnetic stray field acting on the second free layer is advantageously at least 10 mT, preferably at least 30 mT, or a field between these values.

The first free layer may be a PMA layer.

The second free layer may be a PMA layer.

The layer stack may further comprise a third free layer and a coupling layer arranged between the second and third free layers and adapted to provide an anti-parallel coupling of magnetizations of the second and third free layer. The layer stack may accordingly be provided with a synthetic anti-ferromagnetic (SAF) free layer (sub-)stack. A magnetic perturbation by the second free layer on the first free layer may hence be reduced (e.g. due to the opposite magnetization of the third free layer). The second free layer may comprise a Co-comprising ferromagnetic layer. The third free layer may comprise a Co-comprising ferromagnetic layer. The second and third ferromagnetic free layers may each have a (001) crystal structure.

The inventive magnetic layer stack design is applicable to both bottom-pinned and top-pinned MTJ configurations. That is, the second free layer, the reference layer and the tunnel barrier layer may form part of a top-pinned MTJ arranged above the first free layer and the spacer layer. Alternatively, the second free layer, the reference layer and the tunnel barrier layer may form part of a bottom-pinned MTJ arranged below the first free layer and the spacer layer.

The device may comprise a substrate, wherein the layer stack is arranged above the substrate.

By a first feature such as a layer or other structure, being formed "above" or "below" a second feature such as a layer, or other structure, is hereby meant that the first feature is formed above or below, respectively, the second feature (as seen) in a normal direction to the main surface or in-plane extension of the feature, e.g. the layer, or correspondingly in relation to a normal direction to a substrate, if such is present.

The device may comprise an electrode structure configured to supply an SOT-switching current to the SOT-layer. The electrode structure may be configured to inject/extract a write current in/from the SOT layer, such that the write current may be passed through the SOT layer in an in-plane direction.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1:
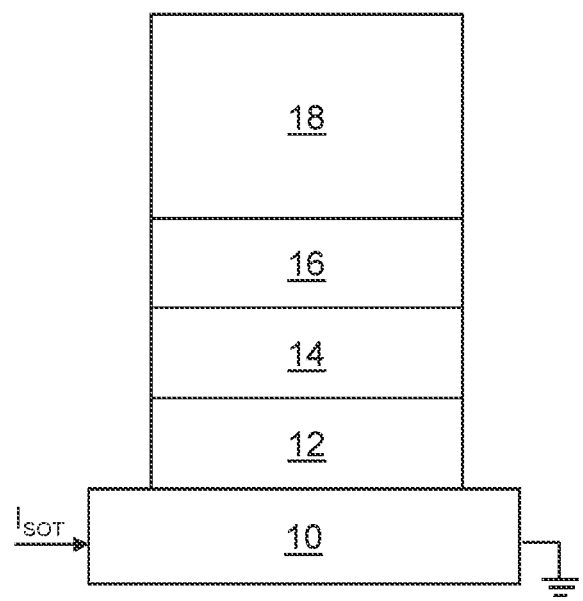
FIG. 1 is a schematic cross-section of a magnetic tunnel junction (MTJ) configured for spin-orbit-torque (SOT)-induced free layer switching.

Various MTJ devices according to the present disclosure will now be described more fully hereinafter with reference to the accompanying drawings. In drawings showing cross-sections of devices, and it is envisaged that the devices of course may extend in directions perpendicular to the plane of the cross-sections. The various layers illustrated in the figures may of course also extend laterally/horizontally beyond the illustrated portions, which are for illustrative purposes only. It should further be noted that the relative dimensions, such as the layer thickness not are drawn to scale. In the drawings, the arrow Y denotes a vertical direction, e.g., normal to a main surface of a substrate of the device. The vertical direction accordingly corresponds to the stacking direction of the layers of the depicted layer stacks. Meanwhile, the arrow X denotes a horizontal direction, e.g., along a main surface of a substrate of the device.

Some MRAMs are based on a magnetic tunnel junction (MTJ) structure. An MTJ comprises two ferromagnetic layers, including a reference layer and a free layer, and a tunnel barrier arranged between the reference layer and the free layer. The direction or orientation of the magnetization of the reference layer is fixed or pinned, and is therefore also referred to as the pinned layer. On the other hand, the direction of the magnetization of the free layer may be switched in relation to the reference layer between two different directions, which may be referred to as a parallel (P) state and an anti-parallel (AP) state. The relative orientations of the magnetization of the reference layer and the free layer determines an electric resistance of the MTJ. The MTJ may present a relatively low resistance when the free layer is in the P state and a relatively high resistance when the free layer is in the AP state. The tunnel magneto-resistance ratio (TMR) is a measure of the difference in the MTJ electrical resistance between the AP state and the P state. Accordingly, by measuring the resistance of the MTJ the magnetization state of the free layer may be sensed. This makes it possible to store data in the free layer, which for this reason also may be referred to as the sense layer or the storage layer.

Some MRAM technologies rely on spin-transfer-torque (STT) as the key switching mechanism of the free layer magnetization. However, alternative switching mechanisms are being researched to increase the switching speed and reduce the power consumption.

Figure 2:
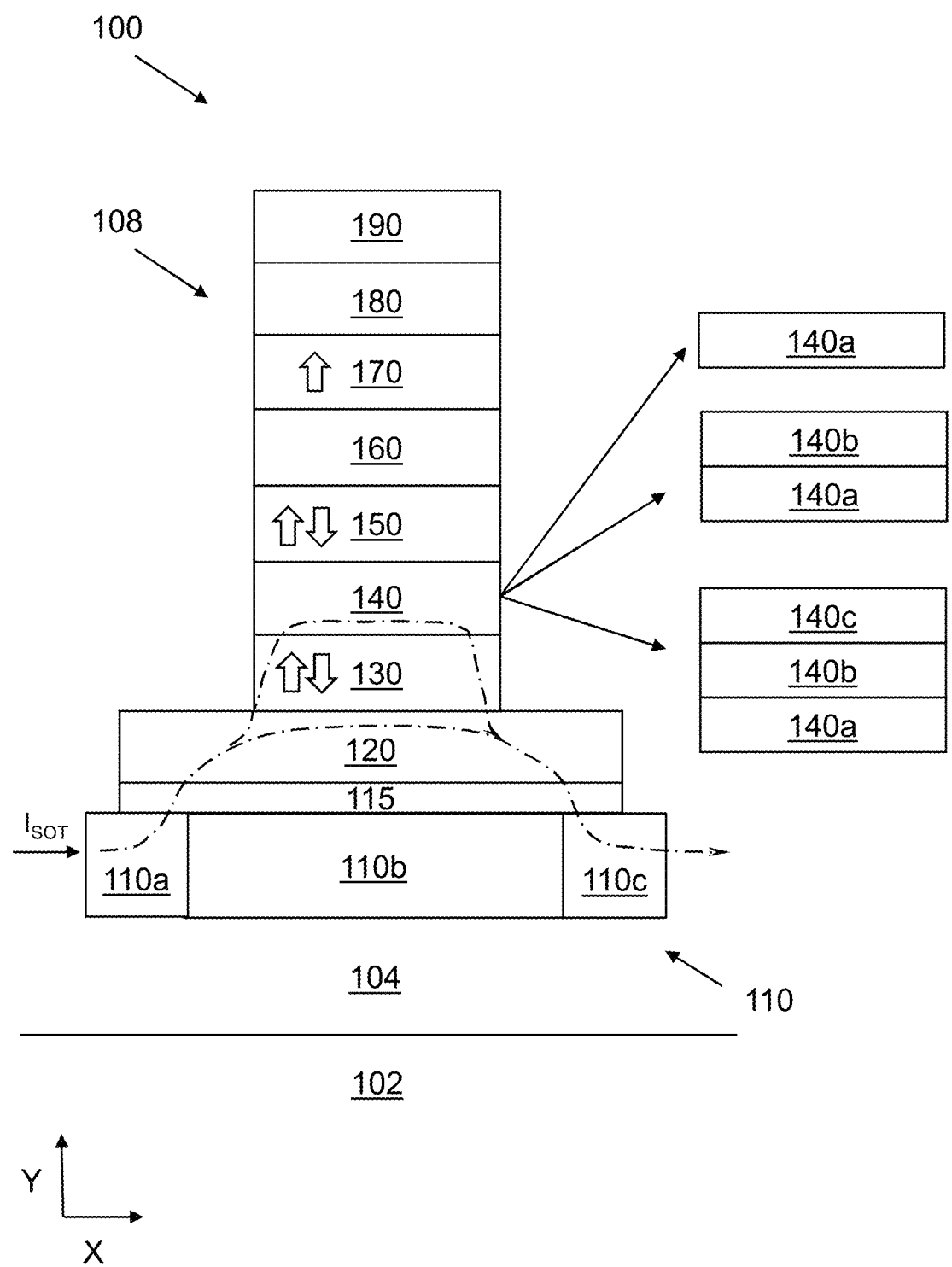
FIG. 2 is a schematic cross-section of a magnetic layer stack comprising a top-pinned MTJ, according to embodiments.

FIG. 2 shows an MTJ device 100. The device 100 comprises a layer stack 108 comprising an SOT layer 120 and a first free layer 130. The layer stack 108 comprises a second free layer 150, a reference layer 170 and a tunnel barrier layer 160 arranged between the second free layer 150 and the reference layer 170. The layer stack 108 comprises a spacer layer 140 arranged as an interfacial layer between the first free layer 130 and the second free layer 150, 250. The spacer layer will be further described below.

The layer stack 108 may as shown be arranged above a substrate 102. The substrate 102 may be a suitable substrate or wafer, such as a semiconductor substrate. Examples of semiconductor substrates include a Si substrate, a Ge substrate, a SiGe substrate, a SiC substrate, a SOI substrate, a GeOI substrate, or a SiGeOI substrate, to name a few. Although not shown in FIG. 2, the substrate 102 may support an active device portion or front-end-of-line (FEOL) portion including active devices. The active devices may be formed in a semiconductor portion of the substrate 102. The devices may include, e.g., logic circuit devices. The devices may include switches used for conducting read and write currents for the device 100, as will be described in more detail below. Example active devices include metal-oxide-semiconductor field-effect transistors (MOSFETs), metal-insulator-semiconductor field-effect transistors (MISFETs), bipolar junction transistors (BJTs), junctionless bipolar transistors or homojunction bipolar transistors (JBTs), fin field-effect transistors (FinFETs), and nanowire FETs, to name a few. As further shown in FIG. 2, the layer stack 108 may be embedded in an interconnect structure 104 arranged on the substrate 102. The interconnect structure 104 may comprise a number of dielectric layers, for instance $SiO_2$ and/or other suitable back-end-of-line dielectrics. The interconnect structure 104 may comprise a number of metal layers embedded in the dielectric layers. Metal layers may for instance be formed by Cu, W, Au, Ag, Al, Co or Ru. Conductive vertical vias may be provided for interconnecting the metal layers. One or more of the metal layers may define read lines, word lines, select lines or the like. The lines of the metal layers may, together with the active devices of the FEOL-portion, define circuitry for controlling reading and writing operations and for driving bit lines, word lines etc.

The SOT-layer 120 is adapted to switch a magnetization direction of the first free layer 130 through SOT. Meanwhile, the first free layer 130 is adapted to generate a magnetic stray field such that a magnetization direction of the second free layer 150 is responsive to a magnetization direction of the first free layer 130. As will be further described, this allows the first free layer 130 to act as a storage layer/write layer of the device 100. The second free layer 150 may, on the other hand, serve as a sensing layer/read layer of the device 100.

The variable magnetization direction of the first and second free layers 130, 150 and the fixed magnetization direction of the reference layer 170 is indicated in FIG. 2 by a pair of oppositely oriented arrows in the first and second free layers 130, 150 and a single arrow in the reference layer 170, respectively. The layer stack 108 may, as shown, comprise a pinning layer 180 arranged above the reference layer 108 and adapted to fix a magnetization direction of the reference layer 170. The MTJ defined by the second free layer 150, the tunnel barrier layer 160 and the reference layer 170 may accordingly be referred to herein as a top-pinned MTJ. An explicit indication of the magnetization direction for the pinning layer 180 has been omitted from FIG. 2. However, the pinning layer 180 may generally have a net magnetization with a same direction as the reference layer 170, opposite to the reference layer 170, or even a zero net magnetization, e.g., in case of a synthetic antiferromagnetic layer (SAF)-pinning layer configuration. It should be noted that the upward orientation of the arrow in the reference layer 170 just represents an example and a downward orientation is equally possible. As suggested by the out-of-plane/perpendicular orientation of the arrows in FIG. 2, a PMA of the first and second free layers 130, 150 and the reference layer 170 (and the pinning layer 180) is assumed. However, it may be noted that an in-plane magnetic anisotropy of the magnetic layers of the MTJ also is possible.

The magnetization of the first free layer 130 may be set to P-state wherein the magnetization of the first free layer 130 assumes a first direction parallel to the magnetization direction of the reference layer 170. The magnetization of the first free layer 130 may be set to an AP-state wherein the magnetization of the first free layer 130 assumes a second direction anti-parallel to the magnetization direction of the reference layer 170. Accordingly, in FIG. 2 the P-state corresponds to an upward orientation of the magnetization vector of the first free layer 130 and the AP-state corresponds to a downward orientation of the magnetization vector of the first free layer 130.

The first free layer 130 may be switched between the P- and AP-states by passing an SOT-switching current ($I_{SOT}$) of a sufficient magnitude in-plane through the SOT layer-120, in either one of a first or second in-plane direction. The critical current magnitude required for inducing SOT magnetization state switching of the first free layer 130 is dependent on, e.g., the materials selected for the SOT-layer 120 and the first free layer 130 and the layer thickness of the first free layer 130. As indicated in FIG. 2, part of the current entering the SOT layer 120 may flow into further layers of the stack, including the free and spacer layers 130 and 140. Accordingly a SOT-current component may flow along the free layer 130 in each of the SOT- and spacer layers 120 and 140.

The first free layer 130 has a non-zero net magnetization in both the P-state and the AP-state. The non-zero net magnetization gives rise to a magnetic stray field external to the first free layer 130. The stray field extends (among others) through the second free layer 150. Inside the second free layer 150 the direction of this stray field (i.e., the orientation of the stray field vectors localized inside the second free layer 150) is determined by the magnetization direction of the first free layer 130. The stray field may torque the elementary magnetic moments of the second free layer 150 contributing to the net magnetization thereof such that the magnetization direction of the second free layer 150 aligns with the direction of the stray field. Assuming the direction of the stray field inside the second free layer 150 is substantially parallel to the magnetization direction of the first free layer 130, it follows that the magnetization direction of the second free layer 150 may be switched between the first and second direction together with the first free layer 130. Under this assumption, the arrows inside the second free layer 150 may also be considered to represent the direction of the stray field. In other words, the second free layer 150 may be switched from a P-state to an AP-state in response to the first free layer 130 being switched from a P-state to an AP-state, or vice versa. More generally, a re-orientation of the magnetization vector of the first free layer 130 may induce a corresponding re-orientation of the magnetization vector of the second free layer 150.

To facilitate the stray field-based switching of the magnetization of the second free layer 150, the first free layer 130 may be adapted to generate a magnetic stray field with a strength exceeding a strength of a reversal field of the second free layer 150. In-case of a non-zero offset of the (hysteresis loop of the) second free layer, the reversal field may be greater for one switching direction and smaller in the other switching direction. Hence, the magnetic stray field strength should exceed a maximum strength of the reversal field of the second free layer 150. For a zero second free layer offset (corresponding to a completely centered hysteresis loop), stray field-based switching of the magnetization of the second free layer 150 may be achieved by adapting the second free layer 150 to present a magnetic coercivity which is less than a strength of the magnetic stray field acting on the second free layer 150. In either case, a strength of the magnetic stray field acting on the second free layer 150 of at least 10 mT may be sufficient to ensure re-orientation of the magnetization vector of the second free layer 150. A stronger stray field of at least 30 mT may allow stray-field coupling also for greater second free layer coercivities. The coercivity of the second free layer 150 is influenced/determined by its magnetic anisotropy and its magnetic moment. The stray field acting on the second free layer is influenced/determined by the saturation magnetization and thickness of the first free layer, and by the spacer layer thickness and the critical dimension (CD) or diameter of the first free layer 130.

As described herein, the first and second directions of the free layer magnetizations are referred to as mutually opposite directions. However, as may be appreciated by a person skilled in the art that, such statements should not be interpreted literally as requiring the magnetization directions to be exactly opposite. In practice, the magnetization directions of a free layer may deviate to some extent from being exactly opposite, depending on, e.g. the degree of PMA, switching efficiency, inhomogeneity of local magnetic field and layer composition etc. This applies correspondingly to statements regarding magnetization vector reversal, which accordingly need not correspond to an exactly 180 degree re-orientation. Preferably, at least the major component of the magnetization vector should be re-oriented by 180 degrees during magnetization vector reversal. Moreover, it is envisaged that the second free layer 150 need not possess a same direction of magnetic anisotropy as the first free layer 130. Indeed, as long as the first free layer switching results in deterministic switching of the second free layer 150 magnetization between states which may be distinguished during read-out, the above operation principle would work.

The device 100 may as shown in FIG. 2 comprise a bottom electrode structure 110 configured to supply an SOT-switching current or write current $I_{SOT}$ to the SOT-layer 120. The electrode structure 110 is configured to inject/extract a write current into/from the SOT layer 120, such that the write current may be passed through the SOT layer 120 in an in-plane direction (e.g., in FIG. 2 from left to right or vice versa). Parts of the SOT-current may further propagate also in-plane through the first free layer 130 and/or the spacer layer 140. The electrode structure 110 comprises a first second electrode portions 110a, 110c spaced apart by an intermediate portion 110b formed of an insulating material. The write current $I_{SOT}$ may accordingly be conducted between the first and second electrode portions 110a, 110c via the SOT-layer 120, as schematically shown in FIG. 2. The first electrode portion 110a may be connected, e.g., to a write line or bit line via a write switch, e.g., of the FEOL-portion of the of the substrate 102. The switch may be controlled by applying a control voltage to a select line. The other terminal of the switch may be connected to a write line. The state of the switch may be controlled by a applying a control voltage to a select line.

The SOT-layer 120 may have a greater footprint than the first free layer 130 (e.g., a greater lateral dimension in a least one lateral direction) to define laterally projecting portions on mutually opposite first and second sides first free layer 130 (e.g. in FIG. 2 on the left and right hand side). The first electrode portion 110a may be connected to the projecting portion on the first side and the second electrode portion 110c may be connected to the projecting portion on the second side. This design of the SOT-layer 120 may improve the SOT switching efficiency since the current path may extend along the entire length of the interface between the SOT-layer 120 and the first free layer 130. However, layer stack designs wherein the SOT-layer 120 is coextensive with the first free layer 130 are also possible.

The device 100 may as shown further comprise a top electrode 190. The top electrode 190 is arranged above the pinning layer 180. The top electrode 190 may be connected to a read line in the interconnect structure, either directly or by a via, to allow a read current to be conducted along a read path extending through the layer stack 108, between the top electrode 190 and the first and/or second electrode portions 110a, 110c. A read switch, such as a FET may be arranged in the read path to allow selective activation of the read path.

A writing operation of the device 100 may comprise passing a write current $I_{SOT}$ through the SOT-layer 120, as disclosed above. Depending on the direction of the write current, the first free layer 130 may be switched to a P-state or an AP-state. In response, the second free layer 150 may be switched to a P-state or an AP-state in accordance with the direction of the magnetic stray field generated by the first free layer 130 and acting on the second free layer 150. A reading operation of the device 100 may comprise measuring a resistance across the layer stack 108. The resistance may be measured by supplying (via the read line) a read current through the layer stack 108, across the MTJ, between the top electrode 190 and either of the first and second electrode portions 110a, 110c, and sensing the resulting voltage drop. A P-state of the second free layer 150 will result in a lower resistance than an AP-state of the second free layer 150, the difference being given by the TMR of the MTJ. A logical "1" may be associated with the lower resistance and a logical "0" may be associated with the higher resistance, or vice versa. Accordingly, data may be written to the MTJ device 100 by switching a magnetization state of the first free layer 130 while data may be read from the MTJ device 100 by sensing a state of the second free layer 150 by detecting a resistance of the MTJ.

The free, reference and pinning layers of the layer stack 108 may be formed as layers possessing PMA. The first and second free layers 130, 150 may comprise a respective ferromagnetic layer. Examples of materials for the free layers 130, 150 include Fe, Co, FeB, CoB, CoFe, CoFeB, WCoFeB and CoFeBTa. Multilayers of Co/X (where X=Ni, Pt or Pd) are also possible. It is envisaged that the free layers 130, 150 may have a multi-layer structure including combinations of the aforementioned materials. A respective thickness of the first and second free layers 130, 150 may be in the range of 0.5 to 2 nm, as an example. The reference layer 170 may comprise a ferromagnetic layer. Examples of materials for the reference layer 170 include Fe, Co, FeB, CoB, CoFe, CoFeB or WCoFeB. Other suitable materials may for example include Ni, FePt, CoGd, CoFeGd, CoFeTb, and CoTb. It is envisaged that the reference layer 170 may have a multi-layer structure including combinations of the aforementioned materials. The barrier layer 160 may include a non-magnetic and electrically insulating layer, such as an oxide layer, for example MgO, $AlO_x$, $MgAlO_x$, $MgGaO_x$ or $MgTiO_x$.

The pinning layer 180 may include one or more hard magnetic layers. The pinning layer 180 may for instance include a superlattice laminate of a repetitive sequence of [Co/Pd], [Co/Pt] or [Co/Ni] bilayers. The pinning layer 180 may also include a Co-layer, an Fe-layer or a CoFe-layer or a superlattice laminate of a repetitive sequence of [Fe/X] or [CoFe/X], where X denotes Pd, Pt, Ni, Tb or Gd. The pinning layer 180 may also include an alloy composition, such as an alloy of Co, Fe or CoFe and Pt, Pd, Ni, Tb or Gd, or a ternary alloy of CoXCr, where X denotes Pt, Ni, Pd, Tb or Gd. Both parallel and anti-parallel coupling of the magnetizations of the pinning layer 180 and the reference layer 170 are possible. The pinning layer 180 may for instance be coupled parallel or anti-parallel to the reference layer 170 via a non-magnetic spacer layer, such as a thin Ru-layer or other RKKY-coupling metal layer such as a Ir-, Os-, or Rh-layer of a thickness providing the desired coupling. A transition layer such a Ta, W, Mo, or alloy thereof or CoX, FeX CoFeX, CoFeBX with X Ta, W, Mo may also be present between the reference layer 170 and the pinning layer 180. The pinning layer 180 may be formed as a synthetic ferromagnetic (SFM) pinning layer or a synthetic antiferromagnetic (SAF) pinning layer. A SAF-type pinning layer 180 may include two hard magnetic layers (e.g. each of a composition as set out above) and separated by a non-magnetic spacer layer, such as a Ru- or Ir-layer, of a thickness such that an anti-parallel coupling is achieved.

The SOT layer 120 may include a layer of an electrically conducting material presenting a relatively large spin-orbit coupling. The SOT layer 120 may be a non-magnetic SOT-generating metal layer. Metal-comprising SOT-layers with negative sign SOT-coefficients include for instance Ta, W, Hf, Ir, IrMn, W, $WO_x$, WN, W(O,N), TaN and TaB. Metal-comprising SOT-layers with positive sign SOT coefficients include for instance Pt, Pd, Hf, Au, AuPt, PtHf, PtMn, FeMn and NiMn. SOT-generating layers also include topological insulator layers such as $Bi_xSe_{1-x}$, $Bi_xSb_{1-x}$ and $(Bi,Sb)_2Te_3$. Topological insulators typically present positive SOT-coefficients. Also SOT-layers of transition metal dichalcogenide material (TMD or $MX_2$) are possible, such as $MoS_2$ and $WTe_2$. The SOT layer 120 may also have a multi-layer structure, e.g., including a combination of two or more of the above-mentioned materials. The SOT layer 120 may be formed with a thickness of, e.g., 10 nm or less, preferably 5 nm or less.

The electrode portions 110a, 110c of the bottom electrode structure 110 may be formed by W, Ta, or TaN or some other conventional electrode material. The insulating intermediate portion 110b may be formed by an oxide such as $SiO_2$ or some other suitable dielectric materials.

To facilitate formation of the SOT-layer 120 above the bottom electrode structure 110 the layer stack 108 may comprise a metal seed/adhesion layer 115 forming an interfacial seed layer between the electrode structure 110 and the SOT-layer 120. The seed layer 115 may be formed by a metal nitride layer XN with X=Ta, Ti, W, Si, Mo or combinations thereof. The seed layer 115 may be formed with a thickness in the range of 1-2 nm, for example.

The top electrode 190 may be a single layer of, for instance, Ru, Ta, or some other suitable electrode material.

The spacer layer 140 physically separates the first free layer 130 from the second free layer 150. The first and second free layers 130, 150 may hence be structurally decoupled from each other. Since the switching of the second free layer 150 is mediated by the stray field generated by the first free layer 130, it is not necessary for the spacer layer 140 to provide a strong interlayer exchange coupling (IEC). Single- as well as composite-layer configurations of the spacer layer are possible, as shown in FIG. 2.

In some embodiments, the spacer layer 140 may be formed by a first spacer sublayer 140a. In these embodiments, the first spacer sublayer 140a may accordingly be arranged in contact with the free layers 130, 150 to form an interfacial layer between the free layers 130, 150. The first spacer sublayer 140a may be a non-magnetic metal layer. As described herein, a non-magnetic layer refers to a non-ferromagnetic layer presenting no or substantially no net magnetization in absence of an external magnetic field. The first spacer sublayer 140a may, for instance, be formed as a layer of Ru, Mo or Ti. The first spacer sublayer 140a may advantageously be formed with a thickness in the range of 1 to 5 nm. The first spacer sublayer 140a may thereby provide a negligible or at least comparably low IEC-strength compared to the stray field. The first spacer sublayer 140a may also be formed as a SOT-generating layer. Examples of possible SOT-generating layers are provided above in connection with the SOT layer 120. Preferably, if the first spacer sublayer 140a is formed as a SOT-generating layer the first spacer sublayer 140a may be formed as a SOT-generating layer with a SOT-coefficient having a sign opposite to that of the first SOT-layer 120.

In some other embodiments, the spacer layer 140 may be formed by a first spacer sublayer 140a and a second spacer sublayer 140b arranged in contact with the first spacer sublayer 140a. In these embodiments, the first spacer sublayer 140a may accordingly be arranged in contact with the first free layer 130 and the second spacer sublayer 140b may be arranged in contact with the second free layer 150. The first spacer sublayer 140a may be a non-magnetic metal layer. The first and the second spacer sublayers 140a, 140b may each be formed by a respective layer of a non-magnetic metal layer, such as Ru, Mo or Ti. Advantageously, the first spacer sublayer 140a may be formed as a SOT-generating layer as mentioned above and the second spacer sublayer 140b may be formed by a non-magnetic metal layer or a non-magnetic metal bi-layer. For example, the second spacer sublayer 140b may be a layer of W, Ti, Pd, Pt, Ta, Ru, Mo or Ti or a bi-layer of Ru/Mo. The spacer layer 140 may advantageously be formed with a thickness in the range of 1 to 5 nm.

In yet some other embodiments, the first and second spacer sublayer composition of the spacer layer 140 may be supplemented with a third spacer sublayer 140c. In these embodiments, the spacer layer 140 may be formed by the first spacer sublayer 140a, the second spacer sublayer 140b arranged in contact with the first spacer sublayer 140a and a third spacer sublayer 140c arranged in contact with the second spacer sublayer 140b. The first spacer sublayer 140a may be arranged in contact with the first free layer 130. The third spacer sublayer 140c may be arranged in contact with the second free layer 150. The second spacer sublayer 140b may be arranged between the first and third spacer sublayers 140a, 140c to form an interfacial layer between the first and third spacer sublayers 140a, 140c. A combined thickness of the first, second and third spacer sublayers 140a, 140b, 140c may be 5 nm or less, preferably in the range of 1-3 nm.

The third spacer sublayer 140c may be a single- or composite layer having a (001) crystal structure orientation. Such orientation may advantageously facilitate the formation of a PMA Fe- or Co-based second free layer 150 on the spacer layer 140. The third spacer sublayer 140c may be formed by at least an oxide layer having a (001) crystal structure orientation. Mg-comprising oxides such as MgO, MgAlO, MgGaO, MgTiO may form an efficient PMA-inducing texturing layer. However, other oxides are also possible, such as $AlO_x$ and $TiO_x$. The oxide layer of the third spacer sublayer 140c may also be supplemented with a CoFeB-layer wherein the third spacer sublayer 140c may be formed as a bilayer of a CoFeB-layer and an oxide layer. The B-content of the CoFeB-layer may promote a (001) crystal texture in the oxide layer, and further into the above-layers of the stack. The CoFeB-layer may be arranged in contact with the second sub-layer 140b and the oxide layer may be arranged in contact with the second free layer 150. A thickness of the CoFeB-layer is preferably 1 nm or less, more preferably 0.4-0.5 nm. The CoFeB-layer may more generally be a B-comprising layer, such as a FeB or CoB layer. The B-content may during device fabrication promote the (001) crystal structure of the oxide layer. The B-comprising layer may be initially deposited as an amorphous layer and during anneal induce the (001) crystal structure of the oxide layer, and possibly also itself assume a (001) crystal structure.

The electrode structure 110 may be formed by depositing and patterning the respective materials for the first and second electrode portions 110a, 110c and the insulating portion 110b using a suitable technique. The further layers of the device 100 and the layer stack 108 may be formed using suitable deposition techniques, such as evaporation or sputtering or molecular beam epitaxy (MBE), atomic layer deposition (ALD), or metal organic chemical vapor deposition (MOCVD), to name a few. Following a layer deposition, a hard mask may be defined on top of the layer stack, for instance including TiN, TaN, TiTaN or spin-on-carbon/spin-on-glass materials. The hard mask for instance have a rectangular or elliptical or round shape. The deposited layers may thereafter be patterned into an MTJ pillar by etching using the hard mask as an etch mask. Possible etching techniques include e.g. anisotropic etch processes such as reactive-ion-etching (ME) or ion-beam-etching (IBE). To enable the enlarged footprint of the SOT-layer 120 the layer stack may be patterned in two steps, comprising first etching the layers above the SOT-layer 120 using a first smaller footprint hard mask and stopping on the SOT-layer 120. Thereafter the SOT-layer 120 (and the optional seed layer 115) may be patterned using a second larger footprint hard mask. Any number of such MTJ-pillars may be patterned in parallel in a same deposited layer stack by forming a plurality of hard masks. The fabrication process may further include one or more annealing steps for causing crystallization of the magnetic layers while applying a magnetic field to the structure for setting a desired magnetization. Annealing may be performed either before or after pillar patterning. Annealing may be performed in a furnace at an ambient temperature of about 400° C. During the anneal, the magnetization directions of the reference layer 170 and the first and second free layers 130, 150 may be aligned with each other.

Figure 3:
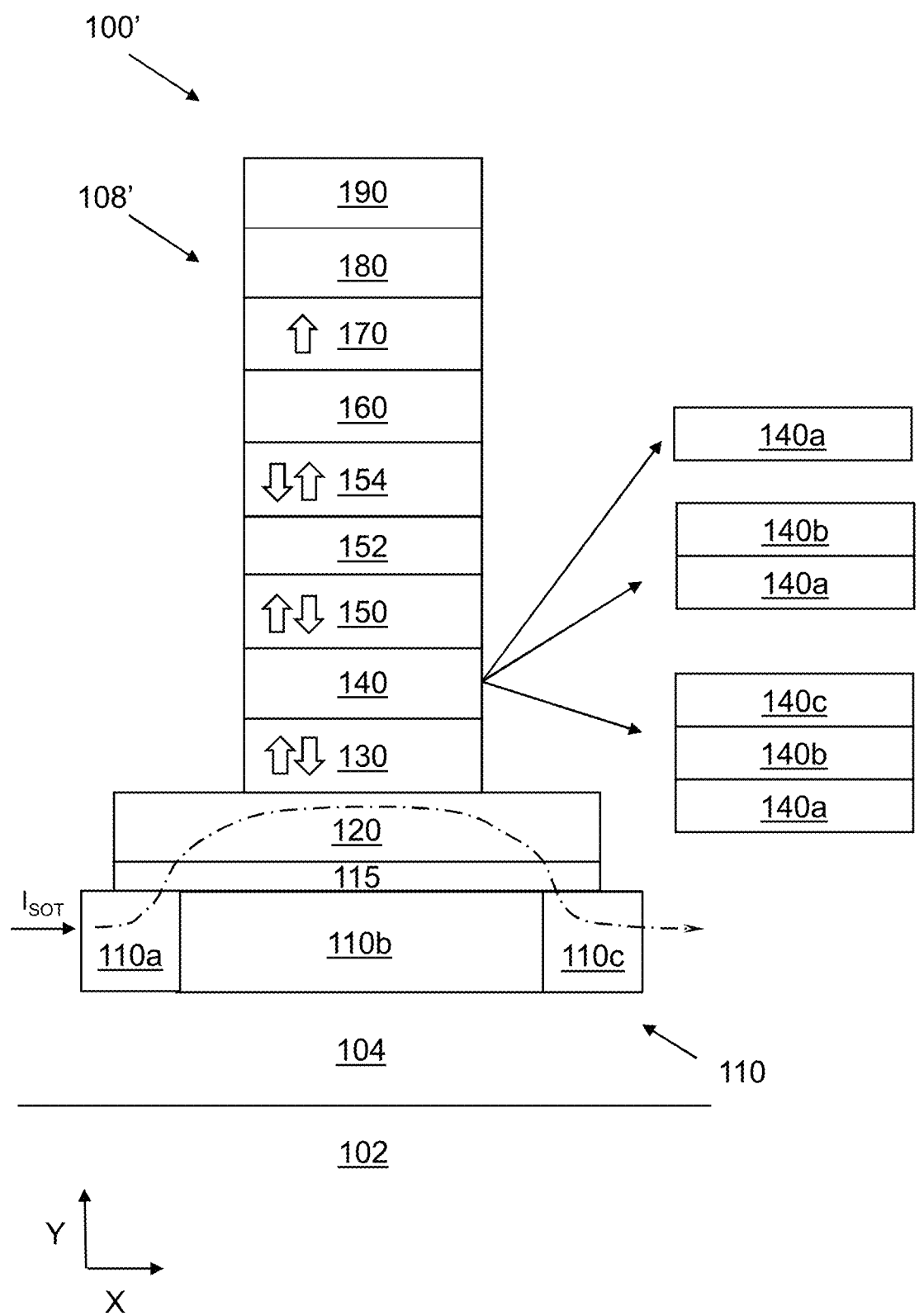
FIG. 3 is a schematic cross-section of a magnetic layer stack comprising a top-pinned MTJ according to a variation, according to embodiments.

FIG. 3 illustrates a variation of an MTJ device 100'. The MTJ device 100' is identical to the MTJ device 100 disclosed in connection with FIG. 2, except that the magnetic tunnel junction of the layer stack 108' comprises a dual-free layer design. More specifically, the layer stack 108' further comprises a third free layer 154 and a coupling layer 152 arranged between the second and third free layers 150, 154 and adapted to provide an anti-parallel coupling of magnetizations of the second and third free layer. The opposite magnetization directions of the second and third free layer 150, 154 is indicated by the oppositely oriented pairs of arrows in said layers of FIG. 3. The third free layer 154 may be formed of any of the materials mentioned above in connection with the second free layer 150. The coupling layer 152 may be formed by a non-magnetic layer, such as a thin Ru-layer or other RKKY-coupling metal layer such as a Ir-, Os-, or Rh-layer of a thickness providing the anti-parallel coupling. Due to the anti-parallel coupling, the net magnetization of the free layer system comprising the second free layer 150, the coupling layer 152 and the third free layer 154 (e.g., the combined net magnetization as seen by the first free layer 130) may be reduced compared to a free layer system comprising only the second free layer 150.

Figure 4:
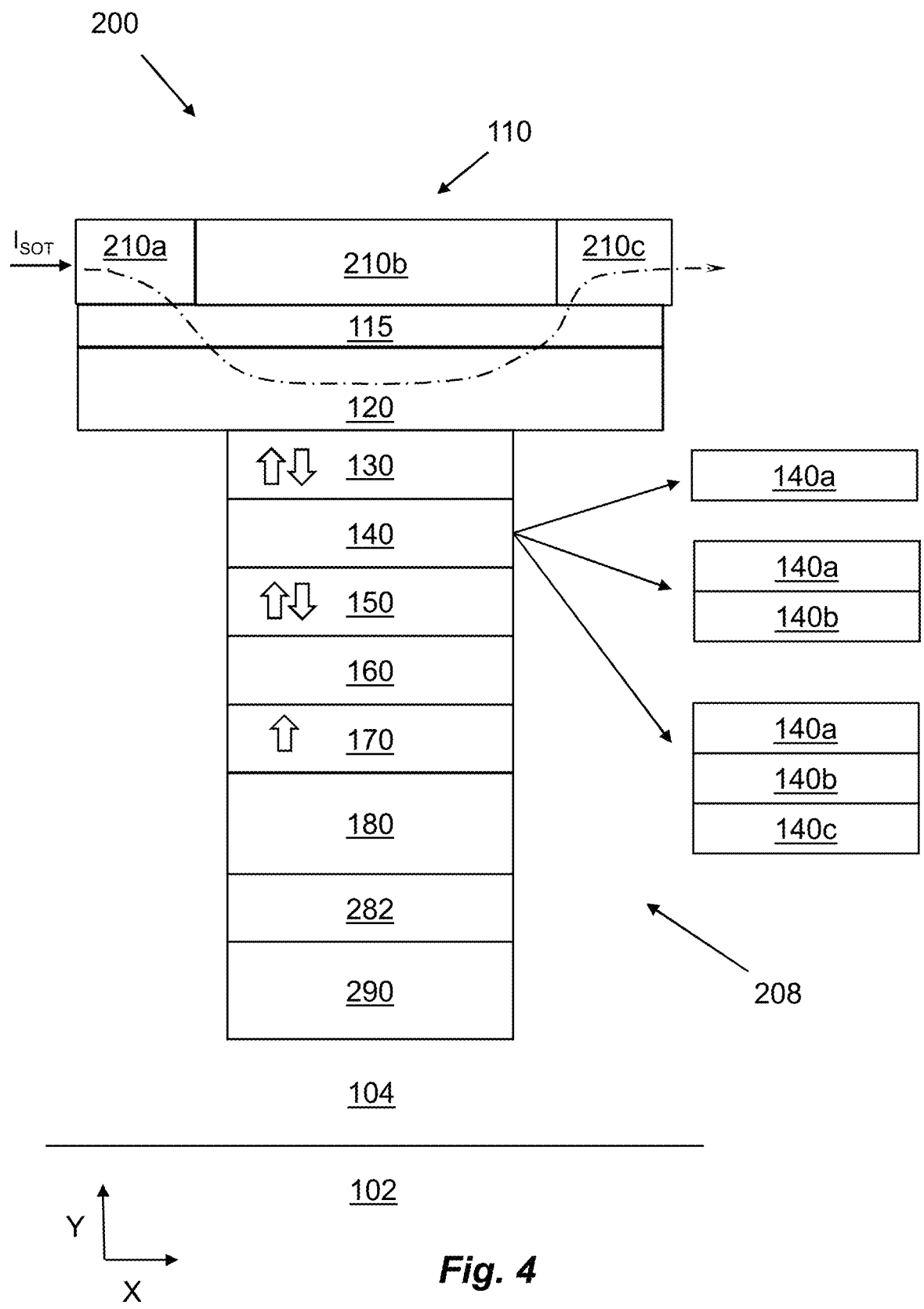
FIG. 4 is a schematic cross-section of a magnetic layer stack comprising a bottom-pinned MTJ according to a variation, according to embodiments.

FIG. 4 illustrates a further MTJ device 200. The MTJ device 200 is similar to the MTJ device 100 and comprises a layer stack 208 similar to the layer stack 108. The MTJ device 200 however differs from the device 100 in that the MTJ thereof is configured as a bottom-pinned configuration. For example, the reference layer 170 and pinning layer 180 are arranged below the second free layer 150. As indicated in FIG. 4, the spacer layer 140 of the layer stack 208 may be formed in a manner corresponding to the spacer layer 140 of the layer stack 108. However, due to the bottom-pinned configuration the relative order of the first to third sublayers 140a-140c shown in FIG. 4 is reversed compared to FIG. 2. A further difference compared to the device 100 is the provision of a top electrode structure 210 arranged above the SOT-layer 120 and configured to supply the write current to the SOT-layer 120. The electrode structure 210 comprises first and second electrode portions 210a, 210c that are spaced apart by an intermediate portion 210b formed of an insulating material, similar to the electrode structure 110 of the MTJ device 100 (FIG. 2). Meanwhile, the layer stack 208 comprises a bottom electrode 290 arranged below the pinning layer 180. The bottom electrode 290 may be connected to a read line in the interconnect structure, either directly or by a via, to allow a read current to be conducted along a read path extending through the layer stack 208, between the bottom electrode 290 and the first and/or second electrode portions 210a, 210c of the electrode structure 210. The above discussion of the bottom electrode structure 110 and the top electrode 190 in connection with the layer stack 108 applies correspondingly to the top electrode structure 210 and the bottom electrode 290, respectively. The layer stack 208 may as shown comprise a seed layer 282 arranged between the bottom electrode 290 and the pinning layer 180. The seed layer 282 may for instance comprise a Pt-layer, a Ru-layer or a Ta-layer, or a stack of two or more of these layers. Such layers may induce a (111) texture for the pinning layer 180.

Figure 5:
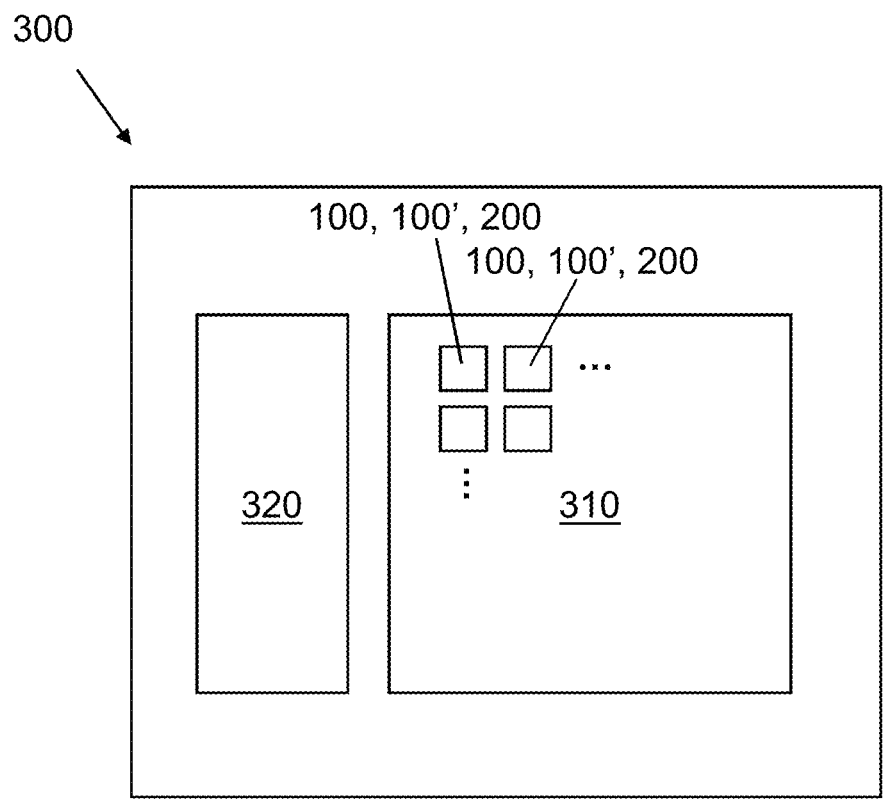
FIG. 5 is a schematic view of a memory device, according to embodiments.

FIG. 5 provides a schematic block view of a circuit device 300. As schematically indicated, the circuit device 300 comprises a plurality of circuit cells 310, for instance arranged in an array comprising a plurality of cell rows and cell columns. Each circuit cell comprises a respective MTJ device of any one of the aforementioned designs, e.g., the device 100, 100' or 200. The circuit device 300 may comprise circuitry 320 for addressing, reading and writing data from/to the respective write layers 130, 230 of the respective MTJ devices of the circuit cells. The circuitry 320 may, e.g., comprise word lines, bit lines, select lines, row and column drivers, sense amplifiers etc. as per se is known in the art. The circuit device 300 may be a magnetic random access memory (MRAM) device wherein each circuit cell forms a memory cell of the MRAM device. However other applications are also possible, such as a non-volatile static random access memory (nvSRAM) device wherein each SRAM bit cell is connected to a respective memory cell comprising an MTJ device configured to provide non-volatile storage of the logic states of the SRAM bit cell.

In the above, the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A magnetic tunnel junction (MTJ) device, comprising:
   a spin-orbit-torque (SOT)-layer and a first free layer;
   a second free layer, a reference layer and a tunnel barrier layer arranged between the second free layer and the reference layer; and
   a spacer layer arranged as an interfacial layer between the first free layer and the second free layer,
   wherein the spacer layer comprises:
      a first spacer sublayer comprising a first metal,
      a second spacer sublayer on the first spacer sublayer and comprising a second metal different from the first metal, and
      a third spacer sublayer on the second spacer sublayer and comprising an oxide,
   wherein the SOT-layer is adapted to switch a magnetization direction of the first free layer through SOT, and
   wherein the first free layer is adapted to generate a magnetic stray field acting on the second free layer such that a magnetization direction of the second free layer is responsive to a magnetization direction of the first free layer.

2. The MTJ device according to claim 1, wherein the first free layer is closer to the SOT-layer relative to the second free layer, and wherein the first spacer sublayer contacts the first free layer.

3. The MTJ device according to claim 1, wherein the first spacer sublayer is an SOT-generating layer arranged in contact with the first free layer, wherein a sign of an SOT-coefficient of the first spacer sublayer is opposite to a sign of an SOT-coefficient of the SOT-layer.

4. The MTJ device according to claim 3, wherein the first spacer sublayer comprises a non-magnetic metal comprising Ru, Mo or Ti.

5. The MTJ device according to claim 2, wherein the second spacer sublayer contacts the first sublayer.

6. The MTJ device according to claim 5, wherein the second spacer sublayer comprises at least two metal layers.

7. The MTJ device according to claim 5, wherein the second spacer sublayer comprises a non-magnetic metal comprising W, Ti, Pd, Pt, Ta, Ru, Mo, Ti or a Ru/Mo bilayer.

8. The MTJ device according to claim 5, wherein the third spacer sublayer contacts the second sublayer, and wherein the third spacer sublayer comprises an oxide layer having a (001) crystal orientation.

9. The MTJ device according to claim 8, wherein the third spacer sublayer further comprises a B-comprising layer, wherein the B-comprising layer contacts the second sublayer, and wherein the oxide layer contacts the second free layer.

10. The MTJ device according to claim 1, wherein a thickness of the spacer layer is 5 nm or less.

11. The MTJ device according to claim 1, wherein the magnetic stray field acting on the second free layer has a strength that exceeds a maximum strength of a reversal field of the second free layer.

12. The MTJ device according to claim 11, wherein the strength of the magnetic stray field exerted on the second free layer is at least 10 mT.

13. The MTJ device according to claim 1, further comprising a third free layer and a coupling layer arranged between the second and third free layers, wherein the third free layer is adapted to provide an anti-parallel coupling of magnetizations of the second and third free layers.

14. The MTJ device according to claim 1, wherein the second free layer, the reference layer and the tunnel barrier layer form part of a top-pinned magnetic tunnel junction arranged above the first free layer and the spacer layer.

15. The MTJ device according to claim 1, wherein the second free layer, the reference layer and the tunnel barrier layer form part of a bottom-pinned magnetic tunnel junction arranged below the first free layer and the spacer layer.

16. The MTJ device according to claim 1, further comprising an electrode structure configured to supply an SOT-switching current to the SOT-layer.

17. The MTJ device according to claim 16, wherein the electrode structure comprises an insulating portion laterally interposed between a pair of conducting portions.

18. A circuit device comprising at least one circuit cell, each circuit cell comprising the magnetic tunnel junction device according to claim 1.

* * * * *